US012125630B2

(12) United States Patent
Chen et al.

(10) Patent No.: US 12,125,630 B2
(45) Date of Patent: Oct. 22, 2024

(54) MICRO-SCALE PLANAR-COIL TRANSFORMER WITH SHIELD

(71) Applicant: Analog Devices International Unlimited Company, Limerick (IE)

(72) Inventors: Baoxing Chen, Westford, MA (US); Wenhui Qin, Shanghai (CN); Yuanyuan Zhao, Malden, MA (US); Xin Yang, Beijing (CN); Shaoyu Ma, Shanghai (CN)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/094,956

(22) Filed: Jan. 9, 2023

(65) Prior Publication Data
US 2023/0162904 A1 May 25, 2023

Related U.S. Application Data

(63) Continuation of application No. 16/396,585, filed on Apr. 26, 2019, now abandoned.

(51) Int. Cl.
*H01F 27/36* (2006.01)
*H01F 27/28* (2006.01)
(Continued)

(52) U.S. Cl.
CPC ......... *H01F 27/2885* (2013.01); *H01F 27/36* (2013.01); *H01L 23/552* (2013.01); *H01L 23/645* (2013.01); *H05K 1/0233* (2013.01)

(58) Field of Classification Search
CPC .... H01F 27/2885; H01F 27/36; H01F 27/363; H01F 27/2871; H01F 27/2804; H01F 2027/2809; H01F 2027/2819; H01L 23/552; H01L 23/645; H05K 1/0233; H05K 1/0218; H05K 3/4644; H05K 2201/0723; H05K 2201/09672; H05K 1/165
See application file for complete search history.

(56) References Cited

U.S. PATENT DOCUMENTS 3,549,825 A   12/1970   Trimble et al.
4,914,561 A    4/1990   Rice et al.
(Continued)

FOREIGN PATENT DOCUMENTS

CN   101228678 A    7/2008
CN   101568976 A   10/2009
(Continued)

OTHER PUBLICATIONS

U.S. Appl. No. 16/396,585, filed Apr. 26, 2019, Chen et al.
(Continued)

*Primary Examiner* — Tuyen T Nguyen
(74) *Attorney, Agent, or Firm* — Wolf, Greenfield & Sacks, P.C.

(57) ABSTRACT

Micro-scale planar-coil transformers including one or more shields are disclosed. The one or more shields can block most common-mode current from crossing from one side to another side of a transformer. Reduction of common-mode current crossing the transformer results in reduction of dipole radiation, which is the main component of electromagnetic interference (EMI) in some transformers.

18 Claims, 11 Drawing Sheets

(51) Int. Cl.
   *H01L 23/552* (2006.01)
   *H01L 23/64* (2006.01)
   *H05K 1/02* (2006.01)

(56) References Cited

U.S. PATENT DOCUMENTS

| | | |
|---|---|---|
| 5,598,327 A | 1/1997 | Someville et al. |
| 5,781,077 A | 7/1998 | Leitch et al. |
| 5,959,522 A | 9/1999 | Andrews |
| 6,291,907 B1 | 9/2001 | Haigh et al. |
| 6,420,952 B1 | 7/2002 | Redilla |
| 6,882,263 B2 | 4/2005 | Yang et al. |
| 7,042,325 B2 | 5/2006 | Giandalia et al. |
| 7,474,190 B2 | 1/2009 | Strzalkowski et al. |
| 7,622,887 B2 | 11/2009 | Yoshimura |
| 7,646,305 B2 | 1/2010 | Cote et al. |
| 7,994,890 B2 | 8/2011 | Edo et al. |
| 8,238,074 B2 | 8/2012 | Steeneken |
| 8,269,594 B2 | 9/2012 | Yoshimura et al. |
| 8,288,894 B2 | 10/2012 | Yoshimura |
| 9,236,171 B2 | 1/2016 | Ito et al. |
| 9,391,016 B2 | 7/2016 | Shen et al. |
| 9,793,203 B2 | 10/2017 | Tao et al. |
| 9,929,038 B2 | 3/2018 | O'Sullivan |
| 10,074,713 B1 | 9/2018 | Briano |
| 11,728,090 B2 | 8/2023 | McGuinness et al. |
| 2005/0128038 A1 | 6/2005 | Hyvonen |
| 2006/0028313 A1 | 2/2006 | Strzalkowski et al. |
| 2006/0065948 A1 | 3/2006 | Yeh et al. |
| 2007/0298520 A1 | 12/2007 | Renaud et al. |
| 2010/0157505 A1 | 6/2010 | Feichtinger et al. |
| 2010/0328012 A1 | 12/2010 | De Rooij et al. |
| 2011/0241160 A1 | 10/2011 | Kerber et al. |
| 2014/0252533 A1 | 9/2014 | O'Sullivan |
| 2016/0152794 A1 | 6/2016 | Diaham et al. |
| 2018/0130867 A1 | 5/2018 | Lambkin et al. |
| 2019/0206981 A1 | 7/2019 | Bonifield et al. |
| 2020/0343037 A1 | 10/2020 | Chen et al. |
| 2021/0249185 A1 | 8/2021 | McGuinness et al. |
| 2024/0006469 A1 | 1/2024 | Diaham et al. |
| 2024/0006470 A1 | 1/2024 | Diaham et al. |

FOREIGN PATENT DOCUMENTS

| | | |
|---|---|---|
| CN | 102255143 A | 11/2011 |
| CN | 204792387 U | 11/2015 |
| CN | 105655113 A | 6/2016 |
| CN | 106024340 A | 10/2016 |
| CN | 106470019 A | 3/2017 |
| CN | 109155535 A | 1/2019 |
| DE | 10 2004 036139 A1 | 3/2006 |
| DE | 10 2011 006 454 A1 | 10/2011 |
| EP | 1 420 420 A2 | 5/2004 |
| EP | 1420420 A * | 5/2004 |
| EP | 1 855 297 A1 | 11/2007 |
| EP | 3 020 050 A1 | 5/2016 |
| FR | 3 008 223 A1 | 1/2015 |
| JP | 2016-531972 A | 10/2016 |
| WO | 98/50956 A1 | 11/1998 |
| WO | 2015/004115 A1 | 1/2015 |

OTHER PUBLICATIONS

Cheung et al., Shielded Passive Devices for Silicon-Based Monolithic Microwave and Millimeter-Wave Integrated Circuits. IEEE Journal of Solid-State Circuits. May 2006; 41(5): 1183-1200.

Islam, Advanced Interfacing Techniques for the Capacitive Sensors. Advanced Interfacing Techniques for Sensors. Smart Sensors, Measurement and Instrumentation. Apr. 2017; 25:73-109.

* cited by examiner

MICRO-SCALE PLANAR-COIL TRANSFORMER WITH SHIELD

CROSS-REFERENCE TO RELATED APPLICATIONS

This application is a Continuation claiming the benefit under 35 U.S.C. § 120 of U.S. application Ser. No. 16/396,585, filed Apr. 26, 2019, and entitled "MICRO-SCALE PLANAR-COIL TRANSFORMER WITH SHIELD," which is hereby incorporated herein by reference in its entirety.

FIELD OF THE DISCLOSURE

The present application relates to micro-scale planar-coil transformers.

BACKGROUND

For micro-scale planar-coil transformers, a large component of electromagnetic interference (EMI) can come from dipole radiation between sides of the transformer. EMI may cause undesirable effects on electronic components.

SUMMARY OF THE DISCLOSURE

Micro-scale planar-coil transformers including one or more shields are disclosed. The one or more shields can block most common-mode current from crossing from one side to another side of a transformer. Reduction of common-mode current crossing the transformer results in reduction of dipole radiation, which is the main component of electromagnetic interference (EMI) in some transformers.

According to aspects of the present disclosure, there is a micro-scale planar-coil transformer arranged on a substrate having an upper surface. The micro-scale planar-coil transformer comprises a first planar coil arranged in a first layer occupying a first area in a plane parallel to the upper surface, a second planar coil arranged in a second layer, and a shield arranged in an intermediate layer, the intermediate layer being between the first and second layers. A projection onto the first planar coil of a region enclosed by a perimeter of the shield covers a second area of the coil that is less than the first area.

According to aspects of the present application, there is a micro-scale planar-coil transformer arranged on a substrate having an upper surface. The micro-scale planar-coil transformer comprises a first side of a transformer comprising a first planar coil arranged in a first layer and configured to couple to a first electrical ground, a second side of the transformer comprising a second planar coil arranged in a second layer and configured to couple to a second electrical ground, a first shield arranged in a first intermediate layer and configured to couple to the first electrical ground, the first intermediate layer being between the first and second layers, and a second shield arranged in a second intermediate layer and configured to couple to the second electrical ground, the second intermediate layer being between the first and second layers.

According to aspects of the present disclosure, there is a micro-scale planar-coil transformer arranged on a substrate having an upper surface. The micro-scale planar-coil transformer comprises a first planar coil arranged in a first layer occupying a first area in a plane parallel to the upper surface, a second planar coil arranged in a second layer, and a shield arranged in an intermediate layer, the intermediate layer being between the first and second layer. A projection onto the first planar coil of a region enclosed by a perimeter of the shield encloses a second area that is equal to the first area.

According to aspects of the present application, there is a micro-scale planar-coil transformer, comprising a first planar coil arranged in a first layer, a second planar coil arranged in a second layer, and means for reducing dipole radiation between the first and second planar coils.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1:
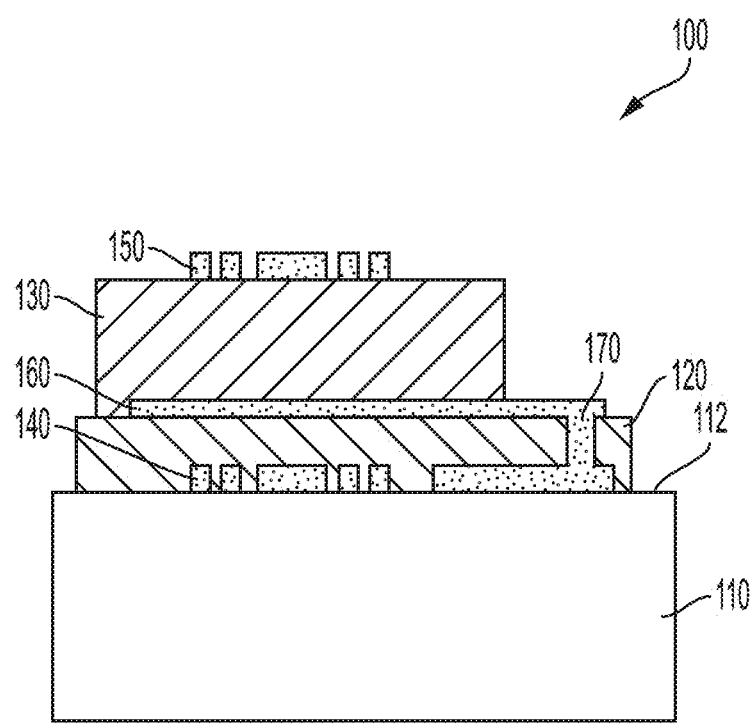
FIG. 1 is a cross-sectional side view of a micro-scale planar-coil transformer.

According to aspects of the present application, a micro-scale planar-coil transformer includes a first planar coil arranged on a primary side of the transformer electromagnetically coupled to a second planar coil arranged on a secondary side of the transformer. The micro-scale planar-coil transformer is configured to exhibit reduced dipole radiation between the primary and secondary sides of the transformer. One or more shields are included between the first and second planar coils to reduce the dipole radiation. The shield(s) may be a Faraday shield.

The present application relates to micro-scale devices. One type of micro-scale device is a planar-coil transformer. Transformers may be used to transform a first voltage level at a first portion of an electrical circuit to a second voltage level at a second portion of an electrical circuit. Transformers may transfer data and/or power signals. Transformers may be used to isolate signals between two portions of a circuit, and thus may form part of an isolator in some embodiments. Transformers typically transfer AC signals. In some scenarios, DC-DC power converters may utilize a transformer, such as a micro-transformer.

According to aspects of the present application, a transformer is arranged having a primary side and a secondary side. The primary side transmits data and/or power signals and the secondary side receives the data and/or power signals. In some embodiments, data and/or power signals may be sent both directions across the transformer.

In some embodiments, the primary side of the transformer is coupled to circuitry which generates the signals that are to be transmitted. In some embodiments, the secondary side of the transformer is coupled to an output. In DC-DC converters utilizing transformers, a rectifier may couple the secondary side to the output such that a signal from the secondary side is rectified prior to being output.

A micro-scale planar-coil transformer may include two or more micro-scale planar coils. A first coil may be arranged on a primary side of the transformer and a second coil may be arranged on a secondary side of the transformer. Each of the first coil and the second coil may be arranged on a substrate in a substantially planar configuration. A planar coil may be patterned on a substrate in a substantially spiral shape about a coil axis.

The primary side may transfer electromagnetic energy to the secondary side. A varying current applied to a first spiral-shaped coil induces a varying magnetic field arranged substantially along a coil axis of the first spiral-shaped coil, and the coils are arranged and electromagnetically coupled such that the varying magnetic field is oriented through the second spiral-shaped coil substantially along a coil axis of the second spiral-shaped coil, which induces a changing current in the second spiral shaped coil on the secondary side.

Some configurations of transformers produce electromagnetic interference (EMI). High levels of EMI can interfere with the performance of electrical devices and may cause undesired effects on components. EMI may come from different source components, and various electrical phenomena may contribute to EMI, such as dipole radiation. In some micro-scale transformers, the main component of EMI is dipole radiation. This is true of some integrated isolated DC-DC converters.

Dipole radiation may occur between the primary and secondary sides of a transformer. Dipole radiation may result from common-mode current crossing an isolation barrier, such as an isolation layer, that is arranged between the primary and secondary coils of a transformer. The common-mode current may cross between the primary and the secondary sides due to a parasitic capacitance between two coils on the different sides of a transformer. For example, if the common-mode current passes from the primary side to the secondary side due to the parasitic capacitance, it may flow back from the secondary side to the primary side in the form of dipole radiation, therefore forming a current loop across the isolation layer. When a first coil and a second coil are arranged on two different substrates, for example, two different printed circuit boards (PCBs), dipole radiation may pass between electrical ground/power planes of the two different substrates.

The common-mode current may be induced by differences in common-mode voltage ripple amplitudes between sides of a transformer. In one exemplary embodiment, a coil of a transformer has two terminals, T1 and T2. In the exemplary embodiment, a first voltage signal, V1, at the terminal T1 and a second voltage signal, V2, at the terminal T2 are each half-sinusoidal and have a same sign. In the exemplary embodiment, the first voltage signal and the second voltage signal are 180 degrees out-of-phase. Due to their half-sinusoidal nature, the first voltage signal and the second voltage signal are not differential. The common-mode voltage, Vcom, may be found as an average of the two signals, where Vcom=(V1+V2)/2. In the exemplary embodiment, a common-mode voltage ripple amplitude of the two terminals T1 and T2 of the coil is greater than substantially zero. The common-mode voltage fluctuates at even harmonics of an applied oscillation frequency.

Shields described herein may be applied to transformers that have one or more coils with a common-mode voltage ripple amplitude greater than substantially zero. However, it should be appreciated that the signals described above are merely one example of a set of voltage signals applied a transformer that result in a common-mode voltage ripple amplitude greater than substantially zero. Other sets of signals resulting in similar common-mode voltages and similar ripples of common-mode voltages are possible. Further, shields described herein are not limited in application to transformers with such signals. In various embodiments, one or more shields are applied to a transformer that exhibits a common-mode current between sides of the transformer, a transformer that exhibits dipole radiation between sides of the transformer, and/or a transformer which exhibits EMI.

A common-mode voltage of two terminals, TC1 and TC2, of a primary side coil, Vcom1, may be found as the average of the voltage of the first terminal, VTC1, and the voltage of the of the second terminal, VTC2, where Vcom1=(VTC1+VTC2)/2. In the exemplary embodiment, the signals applied to the primary side coil are the half-sinusoidal, 180 degree out-of-phase signals with the same sign described above, and the common-mode voltage ripple amplitude of the primary side coil is greater than substantially zero.

A common-mode voltage of two terminals, RC1 and RC2, of a secondary side coil, Vcom2, may be found as the average of the voltage of the first terminal, VRC1, and the voltage of the of the second terminal, VRC2, where Vcom2=(VRC1+VRC2)/2. In the exemplary embodiment, the common-mode voltage ripple amplitude of secondary side coil is substantially zero.

In some embodiments, a coil, for example the primary coil, may be center-tapped in addition to having two terminals, VT1 and VT2. The coil may comprise two coil portions separated by the center tap. A voltage signal applied to the center tap may be a constant voltage, VDD. In some embodiments, the center tap is held to electrical ground. The total common-mode voltage, Vcom, of the center-tapped coil may be found as the average of the common-mode voltage of each of the two coil portions, therefore Vcom=(VT1+VT2)/4+VDD/2.

In some embodiments, there is parasitic capacitance between the two coils on different sides of the transformer. Because of the parasitic capacitance, differences between the common-mode voltage ripple amplitude may introduce a common-mode current crossing the isolation layer from the primary side to the secondary side of the transformer. Typically, the current is small enough that it will not cause safety issues, however, the current flows back to primary side by dipole radiation, which induces high levels of EMI.

As described above, in the exemplary embodiment, the common-mode voltage ripple amplitude of the primary side coil is greater than substantially zero, and the common-mode voltage ripple amplitude of secondary side coil is substantially zero. The difference in ripple amplitudes results in common-mode current passing between sides of the transformer, and therefore also results in dipole radiation between sides of the transformer.

The inventors have recognized that a shield, such as a Faraday shield, can reduce or substantially eliminate the dipole radiation encountered in micro-scale transformers. Thus, aspects of the present application provide a micro-scale transformer having one or more shields between the primary and secondary coils of the transformer.

FIG. 1 shows a cross-sectional side view of a micro-scale planar-coil transformer 100. Micro-scale planar-coil transformer 100 is arranged on a substrate 110 having an upper surface 112, and includes a first coil layer 120, an intermediate layer 130, a first coil 140, a second coil 150, a shield 160, and a via 170.

The micro-scale planar-coil transformer 100 includes a first coil 140. In the illustrative embodiment of FIG. 1, the first coil 140 is arranged in a first coil layer 120. In FIG. 1, the first coil 140 is arranged above the substrate 110. In some embodiments, the first coil 140 is arranged on a primary side of the transformer.

The micro-scale planar-coil transformer 100 includes a second coil 150. The second coil 150 may be arranged in a second coil layer (not illustrated in FIG. 1). The second coil 150 is arranged over and above the first coil 140. In some embodiments, the second coil 150 is arranged on a secondary side of the transformer.

The first coil 140 and the second coil 150 are electromagnetically coupled. In an exemplary embodiment where the first coil 140 is arranged on a primary side of the micro-scale planar-coil transformer 100, and the second coil 150 is arranged on a secondary side of the micro-scale planar-coil transformer 100, the first coil 140 may be a transmit coil and the second coil 150 may be a receive coil. The first coil 140 may transmit signals via electromagnetic energy, which are received by the second coil 150. However, each coil may comprise either a transmit coil arranged on a primary side or a receive coil arranged on a secondary side. For example, in some embodiments, a coil arranged in an upper layer, such as second coil 150, may be arranged on a primary side as a transmit coil and a coil arranged in a lower layer, such as first coil 140, may be arranged on a secondary side as a receive coil.

In FIG. 1, the first coil 140 and the second coil 150 are respectively arranged about a first coil axis and a second coil axis. The coils are patterned in their respective layers such that the coil axes are arranged substantially perpendicular to the upper surface 112. The coil axes are substantially aligned with each other.

A transmit coil is configured to transmit signals to a receive coil. When a changing current is applied to a transmit coil, it induces a changing magnetic field. At close distances to a coil, a changing current flowing through a coil induces a changing magnetic field that is substantially aligned with the axis of the coil. Coil axes of a coil pair may be substantially aligned, and the coils may be arranged at a distance such that an acceptable portion of the changing magnetic field induced by a transmit coil passes through a receive coil. The changing magnetic field applied through the receive coil induces a changing current in the receive coil which facilitates the transfer of power/data signals.

The micro-scale planar-coil transformer 100 includes a shield 160. The shield 160 is arranged between the first coil 140 and the second coil 150, along the direction of the coil axes. The shield may further be arranged at least partially between the first coil 140 and the second coil 150 along directions substantially perpendicular to the coil axes.

In FIG. 1, the shield 160 is arranged in the intermediate layer 130. The intermediate layer 130 is arranged between the first coil 140 and the second coil 150. The intermediate layer may comprise an isolation layer, which may be formed of an insulating or dielectric material. In some embodiments, the intermediate layer 130 may comprise polyimide.

In FIG. 1, the shield 160 is arranged on a side of the intermediate layer 130 that is proximate the first coil 140. In such an arrangement, the shield 160 and the first coil 140 may be configured to couple to a same ground.

Dipole radiation may pass from one side of the micro-scale planar-coil transformer 100 to the other side of the transformer. The dipole radiation may be as a result of common-mode current flowing between the first coil 140 and the second coil 150. The shield 160 may be configured to reduce the dipole radiation between the primary side and the secondary side of the transformer. The shield 160 may reduce the dipole radiation by reducing or substantially eliminating the common-mode current flowing between the first coil 140 and the second coil 150. The shield 160 may be configured to couple to a ground and the common-mode current may be absorbed through the ground coupling.

The micro-scale planar-coil transformer 100 includes a via 170 configured to electrically couple between two layers of the micro-scale planar-coil transformer 100. In FIG. 1, the via 170 couples between the first coil layer 120 and the shield 160 arranged in the intermediate layer 130. The via 170 may couple the shield 160 to a ground that is coupled to elements on the primary side of the transformer or to elements in the first coil layer 120, such as a ground coupled to the first coil 140.

Coils, shields, vias, and other elements may comprise various materials. In some embodiments, coils or shields comprise conductive materials, for example, metals such as copper, gold, or aluminum, or may comprise semiconductor materials, such as doped semiconductor materials. In some embodiments, each coil or shield is arranged in a metallization layer, or is arranged in more than one metallization layer.

The substrate 110 has an upper surface 112. The upper surface 112 may be substantially planar. The upper surface of the substrate 110 is arranged between the substrate 110 and the first coil layer 120.

According to aspects of the present application, a substrate, such as substrate 110, may comprise various materials. In some embodiments, a substrate may comprise a semiconductor material. For example, a substrate may comprise a bulk or monocrystalline semiconductor substrate, such as a bulk or monocrystalline silicon substrate. In some embodiments, a substrate may comprise a deposited semiconductor substrate, such as polycrystalline silicon. In some embodiments, a substrate may comprise a silicon-on-insulator substrate or may comprise a buried oxide layer. Other semiconductor materials may be used as substrates. In some embodiments, a substrate, such as substrate 110, may comprise a PCB.

Figure 2:
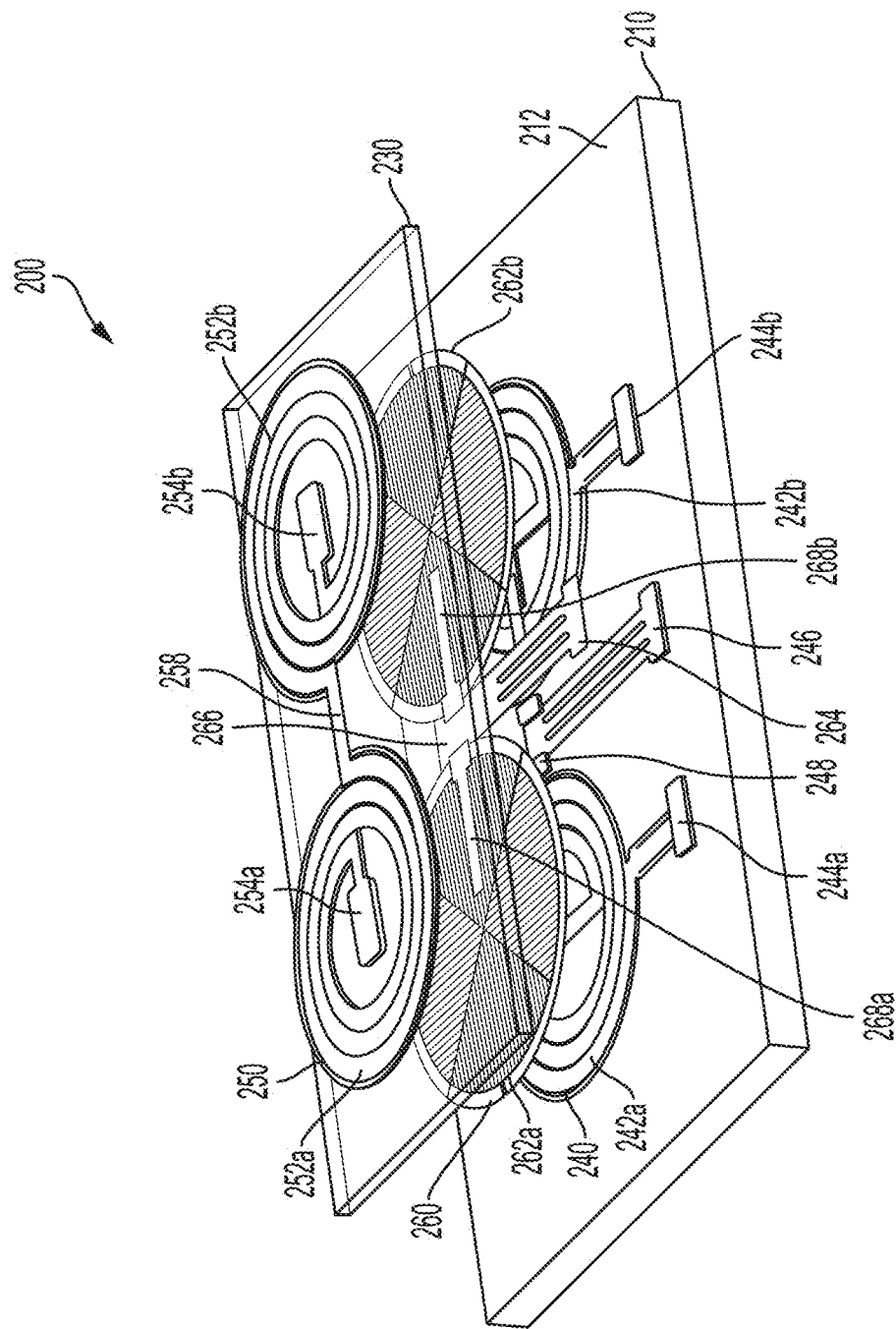
FIG. 2 is an exploded top perspective view of a micro-scale planar-coil transformer.

FIG. 2 shows an exploded top perspective view of a micro-scale planar-coil transformer 200. The micro-scale planar-coil transformer 200 may be a more detailed implementation of the micro-scale planar-coil transformer 100. Micro-scale planar-coil transformer 200 is arranged on substrate 210, and includes an intermediate layer 230, a first coil 240, a second coil 250, and a shield 260.

The first coil 240 includes a first coil portion 242a, a second coil portion 242b, a first pad 244a, a second pad 244b, center tap pad 246, and an intermediate portion 248. In FIG. 2, the two coil portions, first coil portion 242a and second coil portion 242b are arranged in series.

The first coil portion 242a and the second coil portion 242b are each arranged as planar coils. The first coil portion 242a and the second coil portion 242b are patterned as planar spirals having a plurality of turns. In some embodiments, a coil or a coil portion may comprise only a single turn. The first coil portion 242a and the second coil portion 242b are each arranged about coil axes that are substantially perpendicular to an upper surface 212 of the substrate 210.

The first coil 240 is coupled to input and output pads. A first end of the first coil portion 242a is coupled to the first pad 244a, which is arranged outside the first coil portion 242a. A first end of the second coil portion is coupled to a second pad 244b, which is arranged outside the second coil portion 242b. Signals may be applied to the first coil 240 via the first pad 244a and the second pad 244b.

The first coil portion 242a and the second coil portion are coupled by the intermediate portion 248. A second end of the first coil portion 242a is coupled to the intermediate portion 248 of the first coil 240. A second end of the second coil portion 242b is coupled to the intermediate portion 248. As such, the first coil portion 242a is coupled to the second coil portion 242b through the intermediate portion 248.

The intermediate portion 248 may comprise a jumper, such as an overpass portion. An overpass portion couples from an end of a coil located inside the coil portion to a location outside the coil portion. The overpass portion may pass above or below at least one turn of a spiral shaped coil, and may therefore be arranged in a layer above or below the layer of the first coil 240. An overpass portion may be arranged at least partially in a same layer as the first portion and may be arranged at least partially in a different layer as the coil portion.

The intermediate portion 248 is coupled to a center tap pad 246. Signals may be applied to the first coil 240 via the center tap pad 246. For example, the center tap pad may be held to a constant voltage or may be held to ground.

In FIG. 2, the first coil 240 is arranged in an S-coil shape. Other configurations are possible, for example, C-coil shapes. An S-coil shape is arranged such that a current flowing through a first coil portion will spiral in a first rotation direction and current flowing through the second coil portion will spiral in a second rotation direction. The opposite rotation directions of the two portions of the S-coil induce changing magnetic fields which are arranged in substantially anti-parallel directions.

Alternatively, a C-coil shape is arranged such that a current flowing through a first coil portion and current flowing through the second coil portion will spiral in a same rotation direction. The C-coil induces changing magnetic fields which are arranged in substantially parallel directions.

The second coil 250 includes a first coil portion 252a, a second coil portion 252b, a first pad 254a, a second pad 254b, and an intermediate portion 248.

The second coil 250 differs from the first coil 240 in that the first pad 254a is arranged within the first coil portion 252a and the second pad 254b is arranged within the second coil portion 242b. In some embodiments, where the second coil 250 is arranged in a second coil layer, the first pad 254a and the second pad 254b may be left exposed or coupled to a via so that the ends of the second coil 250 may be coupled to other circuit elements. This arrangement of the pads may reduce manufacturing complexity or cost compared to manufacturing the second coil 250 with one or more overpass portions.

The second coil 250 differs from the first coil 240 in that the intermediate portion 258 does not include an overpass portion. Because the first pad 254a and the second pad 254b are arranged within the second coil 250, the intermediate portion may be coupled to the outermost turn of coil 250 and therefore is not required to pass over any turns of the second coil 250 above or below a layer of the second coil 250. This may reduce complexity and cost of manufacture.

The second coil 250 differs from the first coil 240 in that the intermediate portion 258 is not coupled to a center tap pad. In some embodiments, the intermediate portion may be center-tapped, for example, by a via. In some embodiments, the second coil 250 may include a center tap pad coupled to the intermediate portion 258.

The first coil 240 and the second coil 250 are electromagnetically coupled. In some embodiments, the first coil 240 is arranged on a primary side of the micro-scale planar-coil transformer 200, and the second coil 250 is arranged on a secondary side of the micro-scale planar-coil transformer 200. In some embodiments, the first coil 240 is a transmit coil and the second coil 250 is a receive coil.

The first coil portion 242a of the first coil 240 is electromagnetically coupled to the first coil portion 252a of the second coil 250. Similarly, the second coil portion 242b of the first coil 240 is electromagnetically coupled to the second coil portion 252b of the second coil 250. In some embodiments, each of the coil portion couplings may act as an individual transformer coupling, forming two transformers arranged in series. In FIG. 2, each of the portions 242a, 242b, 252a, and 252b are respectively arranged about coil axes the coil axes being substantially perpendicular to upper surface 212 of the substrate 210. The coil axes of each pair of coupled coil portions are substantially aligned.

A coil occupies an area in a plane parallel to the upper surface of the substrate upon which the coil is arranged. The coil area may include the area of any intermediate portions. Similarly, a coil portion occupies an area. The coils making up a pair of coupled coils may occupy a substantially same area. Coil portions making up a pair of coupled coil portions may occupy a substantially same area.

The shield 260 includes first shield portion 262a, second shield portion 262b, shield pad 264, intermediate portion 266, first overpass opening 268a, and second overpass opening 268b. In some embodiments, where coil portions comprise planar spirals, shield portions may have substantially circular perimeters. Shield portions may have perimeters forming other shapes.

Each shield portion may be arranged between a pair of coupled coil portions. In FIG. 2, first shield portion 262a is arranged intermediate the coupled first coil portion 242a of first coil 240 and first coil portion 252a of second coil 250. Second shield portion 262b is arranged intermediate the coupled second coil portion 242b of first coil 240 and second coil portion 252b of second coil 250.

In some embodiments, shield portions are coupled together. The intermediate portion 266 couples the first shield portion 262a to the second shield portion 262b. In some embodiments, the shield 260 does not include an intermediate portion 266, and the first shield portion 262a is not coupled to the second shield portion 262b by an intermediate portion.

According to aspects of the present application, shield 260 has external couplings. In FIG. 2, the intermediate portion 266 is coupled to the shield pad 264. The shield pad may be coupled to power or ground. In FIG. 2, the shield pad 264 is coupled to the intermediate portion 266 and is therefore arranged in a substantially symmetric location of the shield 260. Other arrangements are possible. The shield 260 may be arranged such that the shield 260 is not arranged substantially symmetrically. For example, the shield pad 264 may be arranged at an outer location of the shield 260, distal from the intermediate portion 266.

Shield couplings may be symmetric or asymmetric. Each portion of a transformer itself has significant inductance at high frequencies, therefore at these higher frequencies, a symmetric arrangement can achieve equal shield effectiveness for each of the pairs of coupled coil portions and EMI may be reduced at odd harmonics of an applied oscillation frequency. Symmetric connections may also reduce the resistance of a shield component, as the maximum distance from any one point on the shield to the shield pad is reduced. Reduced shield resistance may result in more effective routing of common mode current to ground.

In some embodiments, other arrangements of shield couplings are used. In some embodiments, a shield is coupled to a first shield pad at a first edge of the shield and is coupled to a second shield pad at a corresponding symmetric second edge of the shield, across the intermediate portion, such that symmetry is maintained. In some embodiments, an asymmetric connection may be used, for example to reduce complexity or cost, with the tradeoff of reduction in shield effectiveness.

The first overpass opening 268a and the second overpass opening 268b are cutouts in the shield 260 configured to accommodate overpass portions of the intermediate portion 248 of first coil 240 within a perimeter of the shield 260.

Overpass openings in shields may be configured to reduce the number of layers in a transformer. When an overpass opening is arranged in a shield, the overpass may be arranged in same layer as the shield. This may allow two coils and a shield to be arranged in a total of three layers. If overpass openings are not arranged in the shield, the same two coils and shield require a total of at least four layers.

In some embodiments, the intermediate portion 258 of second coil 250 includes overpass portions and the intermediate portion 248 of first coil 240 does not. In such an arrangement, the first overpass opening 268a and the second overpass opening 268b of the shield 260 are configured to accommodate the overpass portions of the intermediate portion 258 of second coil 250 instead. In such an embodiment, because second coil 250 is an upper coil, the overpass portions of the second coil 250 may be arranged to pass under turns of the second coil 250. Because the shield 260 is arranged between the coils, the overpass portions of the second coil 250 are arranged in a same layer that the shield 260 is arranged in. Accordingly, this transformer may also comprise only three metallization layers. In this alternative arrangement, the shield 260 may be arranged proximate to second coil 250, and the isolation layer 230 may be arranged between shield 260 and first coil 240. Shield 260 may be coupled to a same ground or power connection that the second coil 250 is coupled to in this arrangement. A perimeter of a shield encloses a region having a shield area. The perimeter of the shield surrounds any shield portions and any intermediate portions of the shield. The region enclosed by the perimeter of the shield includes the area occupied by the physical elements of the shield as well as the area of any gaps between physical elements of the shield that are within the perimeter. Gaps include overpass openings and other gaps, for example, gaps configured to reduce eddy current, described below.

In some embodiments, regions enclosed by shield perimeters may occupy various areas relative to coils, or may cover various areas of coils. In some embodiments, for example, shield 260 in FIG. 2, when the region enclosed by the perimeter of a shield is projected onto an underlying and/or overlying coil, such as first coil 240 or second coil 250, the projection of the region enclosed by the perimeter of the shield covers an area of the coil that is substantially equal to the area occupied by the coil. This may be referred to as a "full shield" arrangement. Other arrangements are possible. In some embodiments, the projection of the region enclosed by the perimeter of the shield covers an area of the coil that is less than the area occupied by the coil. This may be referred to as a "partial shield" arrangement.

Similarly, a perimeter of a shield portion may enclose a region having shield portion area. The perimeter of the shield portion separates the shield portion from any intermediate portions of the shield. In FIG. 2, the perimeter of the first shield portion 262a and the perimeter of the second shield portion 262b are substantially circular. In some embodiments, such as in shield portion 262a in FIG. 2, when the region enclosed by the perimeter of a shield portion is projected onto an underlying and/or overlying coil portion, such as first coil portion 242a of first coil 240 or first coil portion 252a of second coil 250, the projection of the region enclosed by the perimeter of the shield portion covers an area of the coil portion that is substantially equal to the area occupied by the coil portion. Other arrangements are possible. In some embodiments, the projection of the region enclosed by the perimeter of the shield portion covers an area of the coil portion that is less than the area occupied by the coil portion.

Figure 3:
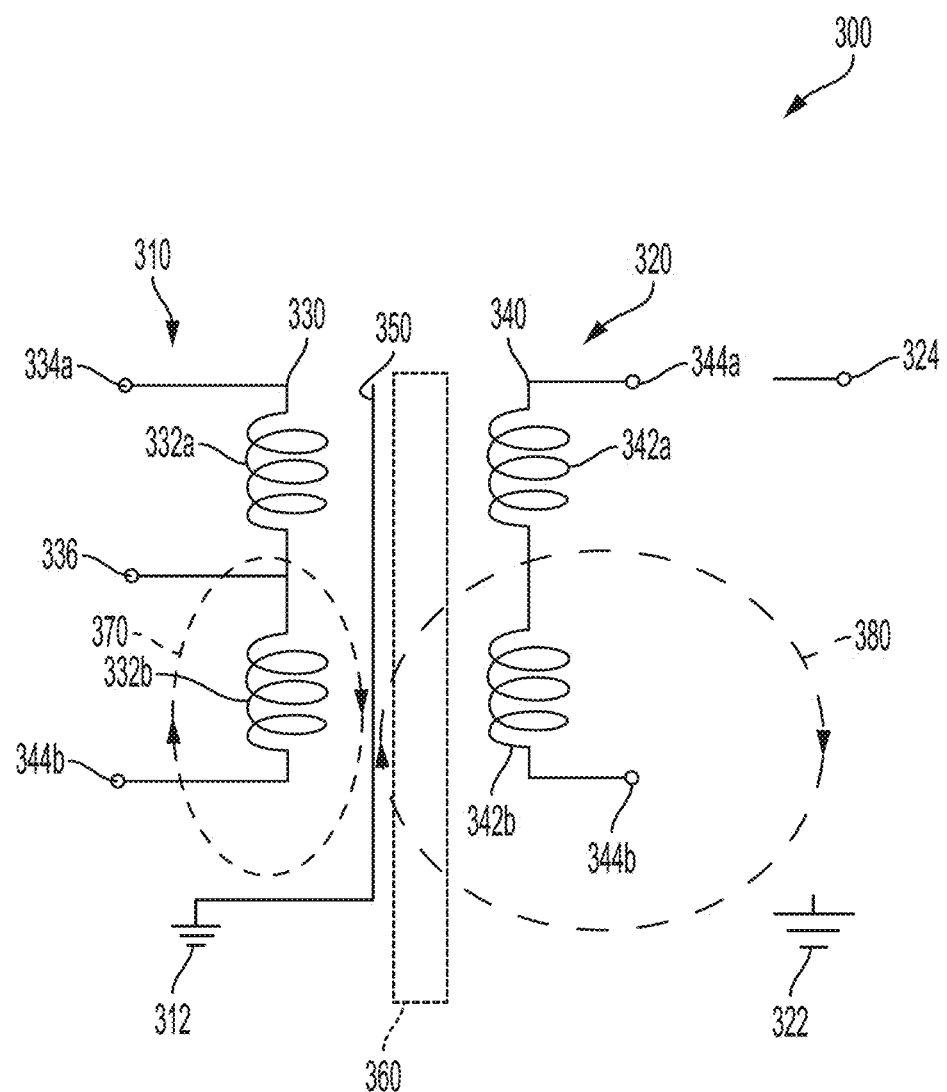
FIG. 3 is a schematic of a circuit comprising a transformer.

FIG. 3 shows an exemplary schematic of a circuit 300. Circuit 300 comprises a transformer The circuit 300 may be a circuit schematic implementation of the micro-scale planar-coil transformer 200. Circuit 300 includes a primary side 310, a secondary side 320, a first coil 330, a second coil 340, a shield 350, and an isolation layer 360.

The primary side 310 is coupled to a primary side ground 312, and the secondary side 320 is coupled to a secondary side ground 322. In FIG. 3, the primary side ground 312 and the secondary side ground 322 are not coupled.

The secondary side 320 includes output 324. The output 324 supplies the output signal from the circuit 300.

The first coil 330 includes a first coil portion 332a and a second coil portion 332b, and the first coil 330 is coupled to a first terminal 334a, a second terminal 344b, and a center tap 336. The first terminal 332a and the second terminal 332b comprise input terminals of the first coil 330. In some embodiments, each of the first terminal 332a and the second terminal 332b are directly or indirectly coupled to the primary side ground 312.

The first coil is coupled to a center tap 336. The center tap 336 is arranged intermediate the first coil portion 332a and the second coil portion 332b.

The second coil 340 includes a first coil portion 342a and a second coil portion 342b, and the second coil is coupled to a first terminal 344a and a second terminal 344b. The first terminal 342a and the second terminal 342b comprise output terminals of the second coil 340. In some embodiments, each of the first terminal 342a and the second terminal 342b are directly or indirectly coupled to the secondary side ground 322 and the output 324. In some embodiments, a transformer comprises a rectifier that is arranged intermediate a second coil and one or more of an output and a secondary side ground.

In FIG. 3, the second coil is not coupled to a center tap. In some embodiments, the second coil 340 is coupled to a center tap, such as a center tap arranged intermediate the first coil portion 342a and the second coil portion 342b.

Input signals may be applied to each of the first terminal 332a and the second terminal 332b. In some embodiments, the signals are independent or non-differential, for example, the half-sinusoidal, 180 degree out-of-phase signals with the same sign described above. When such signals are applied to the first terminal 332a and the second terminal 332b, a common-mode voltage ripple amplitude of first coil 330 is greater than substantially zero. The center tap 336 may be held at a constant voltage or held to ground.

In some embodiments, the common-mode voltage ripple amplitude of the second coil 340 is substantially zero. In some embodiments, the common-mode voltage ripple amplitude of the second coil 340 is greater than substantially zero and less than the common-mode voltage ripple amplitude of the first coil 330.

Due to parasitic capacitance between the first coil 330 and the second coil 340 transformer, the ripple amplitude differences between the first coil 330 and the second coil 340 would introduce a common-mode current crossing the from the primary side 310 to the secondary side 320 of the circuit 300, which would flow back to primary side 310 by dipole radiation, potentially inducing unacceptable levels of EMI.

However, the shield 350, arranged in the isolation layer 360, is configured to reduce the dipole radiation between the primary side 310 and the secondary side 320. The shield 350 may comprise a Faraday shield, and is arranged between the first coil 330 and the second coil 340. The shield 350 is configured to block the electric field between the first coil 330 and the second coil 340. Accordingly, most or substantially all of the common-mode current is blocked by the shield, and absorbed by a power or ground coupled to the shield 350, for example, primary side ground 312. As such, most or substantially all of the common-mode current only flows in loop 370 on the primary side 310 and will not cross the isolation layer 360. The loop 370 is entirely on primary side 310, and therefore substantially zero common-mode current from loop 370 will cross the isolation layer 360, and will not cause dipole radiation and induce EMI.

In some embodiments, a common-mode voltage ripple amplitude of the second coil 340 is greater than substantially zero. Accordingly, some common-mode current may the isolation layer 360 cross from the secondary side 320 to the shield 350 via loop 380. Some dipole radiation may occur from loop 370, but the dipole radiation is reduced or substantially eliminated.

Figure 4:
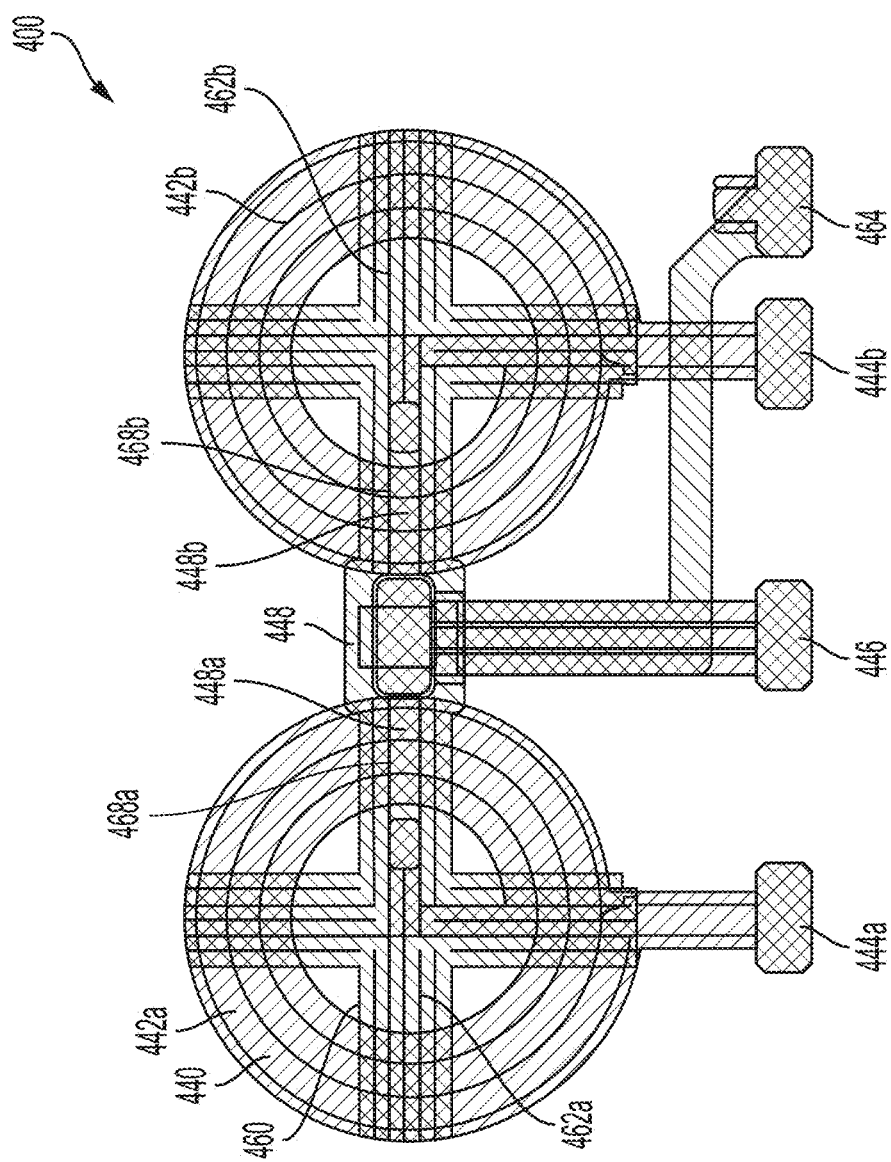
FIG. 4 is a top view of some components of a micro-scale planar-coil transformer.

FIG. 4 shows a top view of some components of a micro-scale planar-coil transformer 400. The components of a micro-scale planar-coil transformer 400 comprise a first coil 440 and shield 460. The first coil 440 and the shield 460 may be arranged primarily in different layers of micro-scale planar-coil transformer 400.

The first coil 440 includes a first coil portion 442a, a second coil portion 442b, a first pad 444a, a second pad 444b, center tap pad 446, and an intermediate portion 448 comprising first overpass portion 448a and second overpass portion 448b.

In FIG. 4, overpass portions cross over turns of the coil portions. First overpass portion 448a is arranged in a same layer as shield 460 and couples an end of the first coil portion 442a that is within the first coil portion 442a to the second coil portion 442b, crossing above the turns of the first coil portion 442a. Similarly, second overpass portion 448b is arranged in the same layer as shield 460 and couples an end of the second coil portion 442b that is within the second coil portion 442b to the first coil portion 442a, crossing over turns of the second coil portion 442b.

Alternatively, overpass portions may connect ends of a coil to coil pads. In such an arrangement, the overpass portions may cross from within first coil portion 442a to the first pad 444a and from within the second coil portion 442b to the second pad 444b. In such an arrangement, the intermediate portion 448 do not include an overpass portion, and are be arranged entirely in the layer of the first coil. Overpass openings in the shield are arranged to accommodate the alternative location of overpass portions.

The shield 460 includes first shield portion 462a, second shield portion 462b, shield pad 464, intermediate portion 466, first overpass opening 468a, and second overpass opening 468b. The first overpass portion 448a is arranged within the first overpass opening 468a and the second overpass portion 448b is arranged within the second overpass opening 468b.

Overpass portions and their corresponding overpass openings in shields may provide reduced shield effectiveness. When an overpass overlies a portion of the coil, that portion of the coil is therefore not covered by a shield, which may reduce shield effectiveness or provide a noise source. An overpass or an underpass in a non-shield layer may increase shield effectiveness at the cost of requiring additional layers. In some partial shield arrangements, an overpass portion may alternatively pass over a portion of a coil not covered by a shield perimeter. In some embodiments, shield area may include area occupied by overpass portions.

In some embodiments, alternative shield couplings may be used. For example, in some embodiments, a shield may be coupled to a center tap. In such an embodiment, portions of the shield can act as the overpass portion of the coil. Accordingly, a separate shield pad and center tap pad are not required. Such an arrangement can reduce manufacturing cost and complexity but may reduce shield effectiveness in some embodiments.

The inventors have recognized that in some transformer configurations, a shield covering less than the full area of a coil may further reduce or substantially eliminate dipole radiation. For example, when common-mode voltage ripple amplitude of coils on both a primary side and secondary side are greater than substantially zero, shields that do not fully cover the coils may be used. In such a configuration, only a single shield may be used.

In FIG. 4, when the region enclosed by the perimeter of a shield 460 is projected onto the underlying or overlying coils, for example first coil 440, the projection of the region enclosed by the perimeter of the shield 460 covers an area of the first coil 440 that is less than the area occupied by the first coil 440.

Similarly, when a region enclosed by the perimeter of a shield portion such as shield portion 462a, is projected onto the underlying and/or overlying first coil portion, such as first coil portion 462a, the projection of the region enclosed by the perimeter of the shield portion 462a covers an area of the coil portion 442a that is less than the area occupied by the coil portion 442a.

In some embodiments, the common-mode voltage ripple amplitude of a first coil is greater than substantially zero, and the common-mode voltage ripple amplitude of a second coil is greater than substantially zero and less than the common-mode voltage ripple amplitude of the first coil.

The inventors have recognized that the dipole radiation may be reduced if the common-mode current is reduced or substantially eliminated by matching common mode voltage ripple amplitudes. As discussed above, there is a parasitic capacitance between first and second coils. If voltages applied to plates of a capacitor are the same, then there will be no current crossing the capacitor. Similarly, if the common-mode voltage ripple amplitude is matched on the first and second coil, common-mode current will not flow. Accordingly, the common-mode current may be eliminated, and therefore no dipole radiation will cross between the sides.

The inventors have recognized that the area of a partial shield covering a coil may be configured so that the exposed common-mode voltage ripple amplitude of a primary side and the exposed common-mode voltage ripple amplitude of a secondary side more closely match or substantially match each other. A partial shield may covering a percentage A of a transmit coil may absorb percentage A of the common-mode voltage ripple amplitude and expose the receive coil to a percentage B of the transmit coil's common-mode voltage ripple amplitude, where the percentage B is substantially equal to percentage A subtracted from 100 percent.

The first coil may occupy a first area in a plane parallel to an upper surface of a substrate. The coupled second coil may occupy substantially the first area. A projection onto the first coil of a region enclosed by a perimeter of a shield, in the plane, may cover a second area of the coil that is less than the first area.

In some embodiments, an area ratio comprising a ratio of the second area to the first area is related to or at least partially based on a ripple ratio that is a ratio of the second common-mode voltage ripple amplitude of the second coil to the first common-mode voltage ripple amplitude of the first coil. For example, if the ripple ratio is less than 1, a shield and a coil may be patterned to have an area ratio that is less than 1. In some embodiments, the area ratio and the ripple ratio comprise substantially complementary percentages. Complementary percentages add up to a value of 1, or to 100 percent. Therefore, the first ratio and the second ratio substantially add up to a value of 1, or to 100 percent. Accordingly a shield may be patterned to have an area ratio in relation to the coils that is substantially equal to the ripple ratio subtracted from a value of 1, or from 100 percent.

The inventors have recognized that, for some transformers, the ripple ratio is related to the coupling factor, k, of the first coil and the second coil. Accordingly, in some embodiments, the area ratio may be related to or at least partially based on the coupling factor of the coils. In some embodiments, the ripple ratio is directly proportional to the coupling factor of the first coil and the second coil. In some embodiments, the ripple ratio may substantially equal the coupling factor. Accordingly, in some embodiments, the area ratio and the coupling factor substantially add up to a value of 1, or to 100 percent. A shield may therefore be configured to have an area ratio that is substantially equal to the coupling factor subtracted from a value of 1, or from 100 percent.

The coupling factor, k, of a transformer is affected by coil diameter, distance between coils, coil alignment, and bonding wire inductance, among other factors. The coupling factor k is not substantially affected by the circuits coupled to the transformers, such as driving or rectifying circuits.

The same principles may be additionally or alternatively applied to shield portions and coil portions as they are applied shields and coils herein.

The inventors have recognized that is beneficial to block only the electric field and to allow the magnetic field to substantially pass through a shield. In some embodiments, such as shield 460 in FIG. 4, a shield may be configured to substantially block an electric field from passing through the shield. The shield may be configured to reduce or substantially eliminate the amount of the magnetic field that is blocked by the shield, so that the magnetic field is substantially entirely passed through the shield.

A shield applied to a spiral-shaped coil may be arranged having an overall circular perimeter and covering the entirety of the coils, or may be arranged having other perimeter shapes which only partially cover the coils. A shield which is configured to substantially block the electric field and substantially the pass magnetic field is not arranged purely as a circular shape. A shield, for example shield 460 or shield 1060 described below, may be divided into many narrow stripes. Such a shield may be comprised of a plurality of high aspect ratio segments configured to reduce eddy currents in the shield. The plurality of high aspect ratio segments may be patterned to form the overall circular or other shape of the shield.

Eddy currents are closed loops of electrical current which may be induced in the shield or another electrical conductor perpendicular to a changing magnetic field passing through. The physical space through which the changing magnetic field passes determines the size of the eddy current loop. The magnitude of the current is proportional to the size of the loop. A larger current corresponds to a larger loss in energy from the magnetic field, which decreases the efficiency of the transformer. Therefore, reducing the size of the loop, for example by using the high aspect ratio segments, will allow more of the magnetic field to pass through the shield and will reduce or substantially eliminate the effect of reduced efficiency from eddy current.

In some embodiments, a non-shield technique may be used to at least partially cancel the ripple of one or more sides of a transformer. Accordingly, a single full shield may be used to block common-mode voltage ripple amplitude of another side of the transformer, such that the ripples of each side are separately removed.

Figure 5:
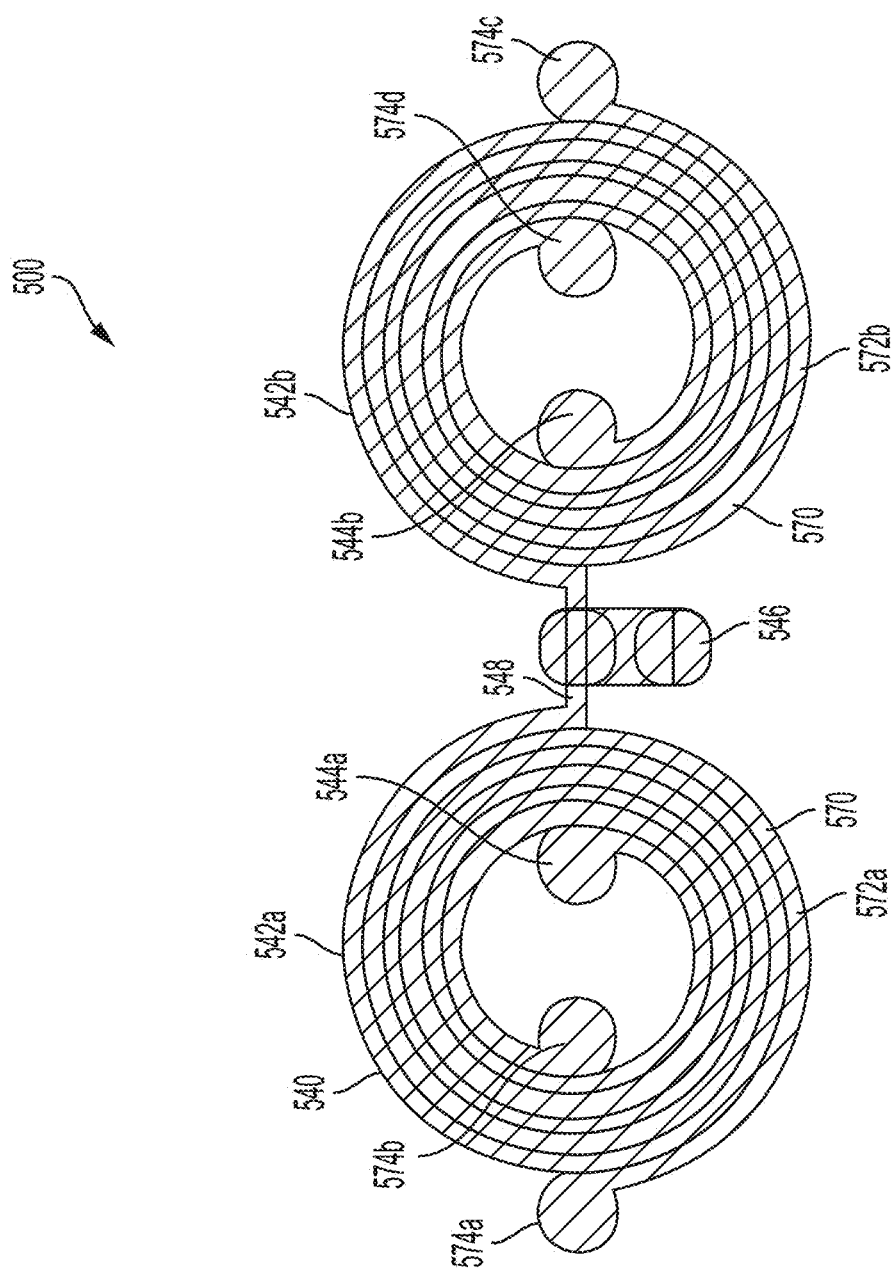
FIG. 5 is a top view of some components of a micro-scale planar-coil transformer.

FIG. 5 shows a top view of some components of a micro-scale planar-coil transformer 500. The components of a micro-scale planar-coil transformer 500 comprises a first coil 540 and a second coil 570. First coil 540 comprises first coil portion 542a and second coil portion 542b coupled together by intermediate portion 548. The first coil 540 is coupled to pads 544a and 544b. Intermediate portion 548 is coupled to center tap pad 546. Second coil 570 comprises a first coil portion 572a and a second coil portion 572b, which are not coupled by an intermediate portion. First coil portion 572a is coupled to pads 574a and 574b. Second coil portion 572b is coupled to pads 574c and 574d. The first coil 540 and the second coil 570 may each be arranged on the primary side of a transformer and may be arranged in a lower layer.

Separate signals are applied to first coil 540 and second coil 570 by their respective pads. An oscillation direction of the applied signals may be substantially adverse, such that the common-mode ripple of the first coil 540 and the second coil 570 is also adverse. Accordingly, the total common-mode ripple of the two primary side coils may substantially match and substantially cancel each other, and as a result, the common-mode voltage ripple amplitude of the primary side may be substantially zero.

In some embodiments, center tap pad 546 comprises two separate pads. The first pad is coupled to first coil portion 542a, and the second pad is coupled to second coil portion 542b, with no connection between the first pad and the second pad via any intermediate portion. Such an arrangement can result in an increased match between the first coil 540 and the second coil 570. The increased match can occur in the two pad configuration due to the shapes of each coil and pad arrangement for first coil 540 and second coil 570 being more similar than in the single pad configuration. In some embodiments, in the two pad configuration, the shapes of each coil and pad arrangement for first coil 540 and second coil 570 are substantially the same. The arrangement requires an additional bonding wire connection for the second pad.

Figure 6:
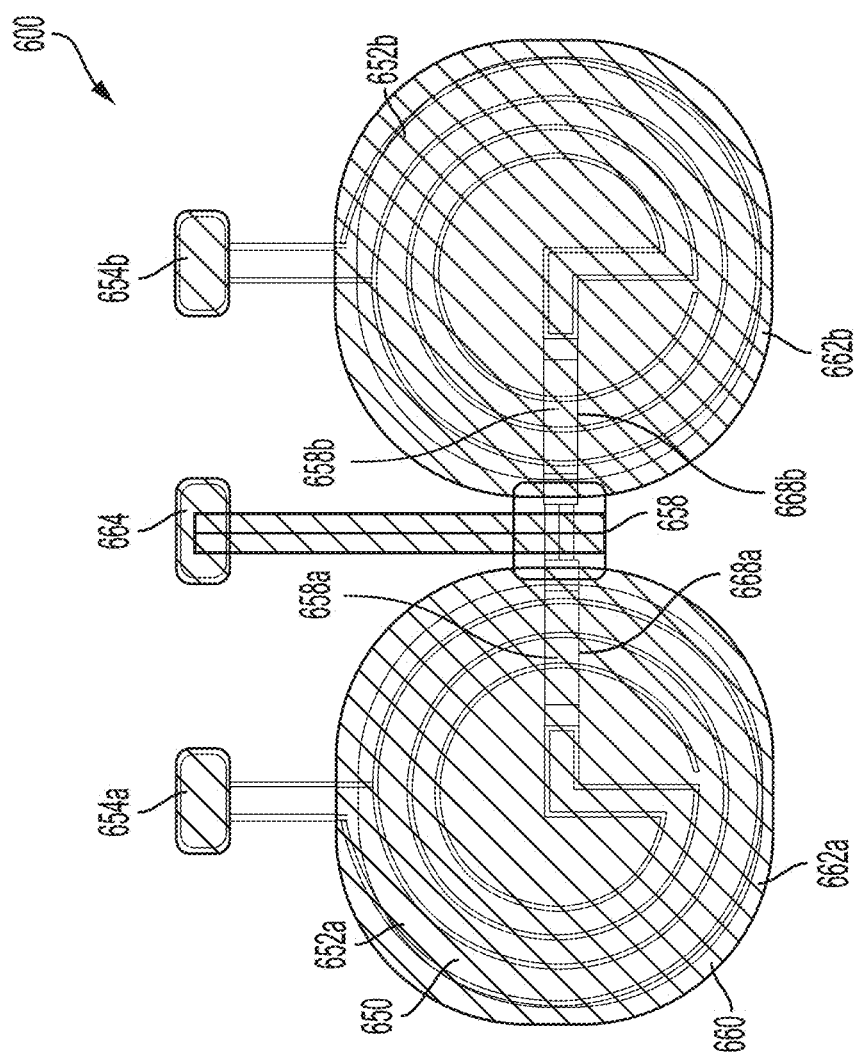
FIG. 6 is a top view of some components of a micro-scale planar-coil transformer.

FIG. 6 shows a top view of some components of a micro-scale planar-coil transformer 600. The components of a micro-scale planar-coil transformer 500 and the components of a micro-scale planar-coil transformer 600 may form a same transformer. The components of a micro-scale planar-coil transformer 600 comprises a third coil 650 and a shield 660.

The third coil 650 includes a first coil portion 652a, a second coil portion 652b, a first pad 654a, a second pad 654b, and an intermediate portion 658 including first overpass portion 658a and second overpass portion 658b. The third coil 650 may be arranged on the secondary side of a transformer, and may be arranged in an upper layer.

The shield 660 includes first shield portion 662a, second shield portion 662b, shield pad 664, intermediate portion 666, first overpass opening 668a, and second overpass opening 668b.

In some embodiments, the third coil 650 may be electromagnetically coupled to the first coil 540 and the second coil 570. As described above, the common-mode voltage ripple amplitude of the primary side including coils 540 and 570 may be substantially zero from a non-shield technique. Accordingly, shield 660 is a single full shield used to block common-mode voltage ripple amplitude of the secondary side that includes third coil 650, such that the ripple of both sides ripples is removed.

Figure 7:
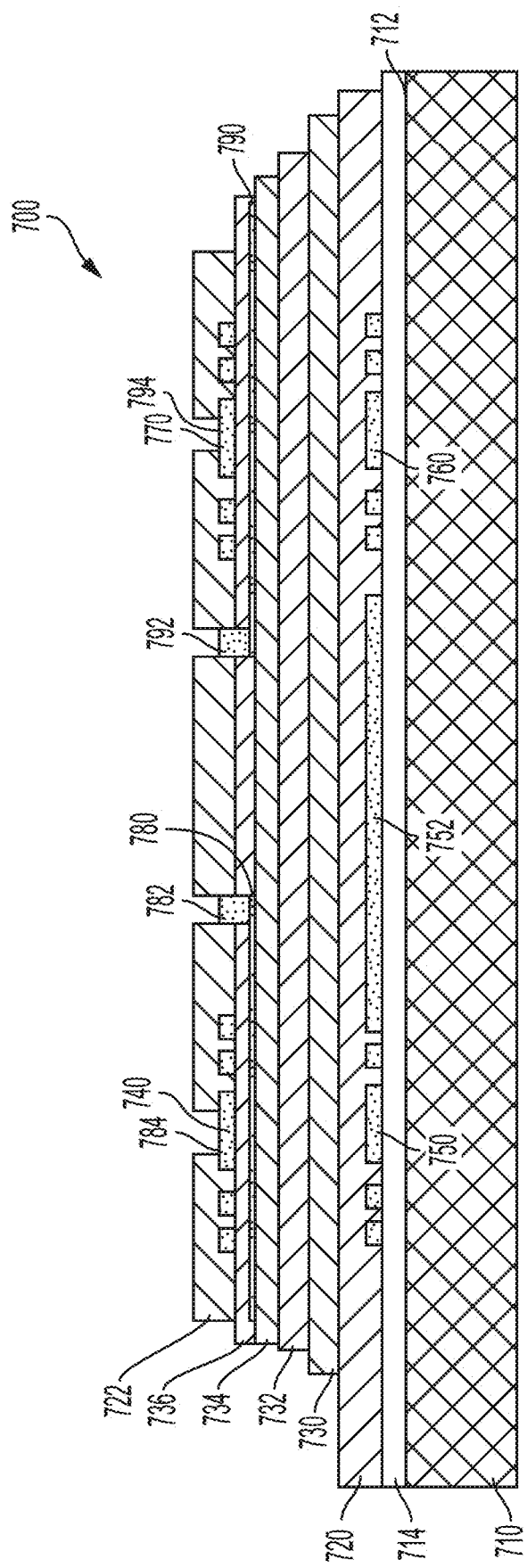
FIG. 7 is a cross-sectional side view of a micro-scale planar-coil transformer.

Shields may be applied to back to back transformers. FIG. 7 shows a cross-sectional side view of a micro-scale planar-coil transformer 700. Micro-scale planar-coil transformer 700 comprises a back to back transformer. Micro-scale planar-coil transformer 700 is arranged on a substrate 710 having an upper surface 712, and includes an underlying layer 714, lower coil layer 720, intermediate layers 730, 732, 734, and 736, upper coil layer 722, a first coil 740, a second coil 750, coil coupling 752, third coil 760, fourth coil 770, first shield 780, second shield 790, first via 782 and second via 792. Portions 784 and 794 of the coils may be exposed to provide coupling points.

The shields may be arranged more proximate first coil 740 and fourth coil 770 so that the common-mode current does not cross the isolation layer. The first shield 780 and the second shield 790 may be arranged above the intermediate layers 730, 732, and 734, and under the intermediate layer 736 so that the first shield and the second shield are arranged closer to the first coil 740 and the fourth coil 770 than to the second coil 750 and the third coil 760. Having the shields 780 and 790 arranged closer to the coils 740 and 770 may reduce the distance into the isolation layers that any current loop from the coils 740 and 770 travels.

Figure 8:
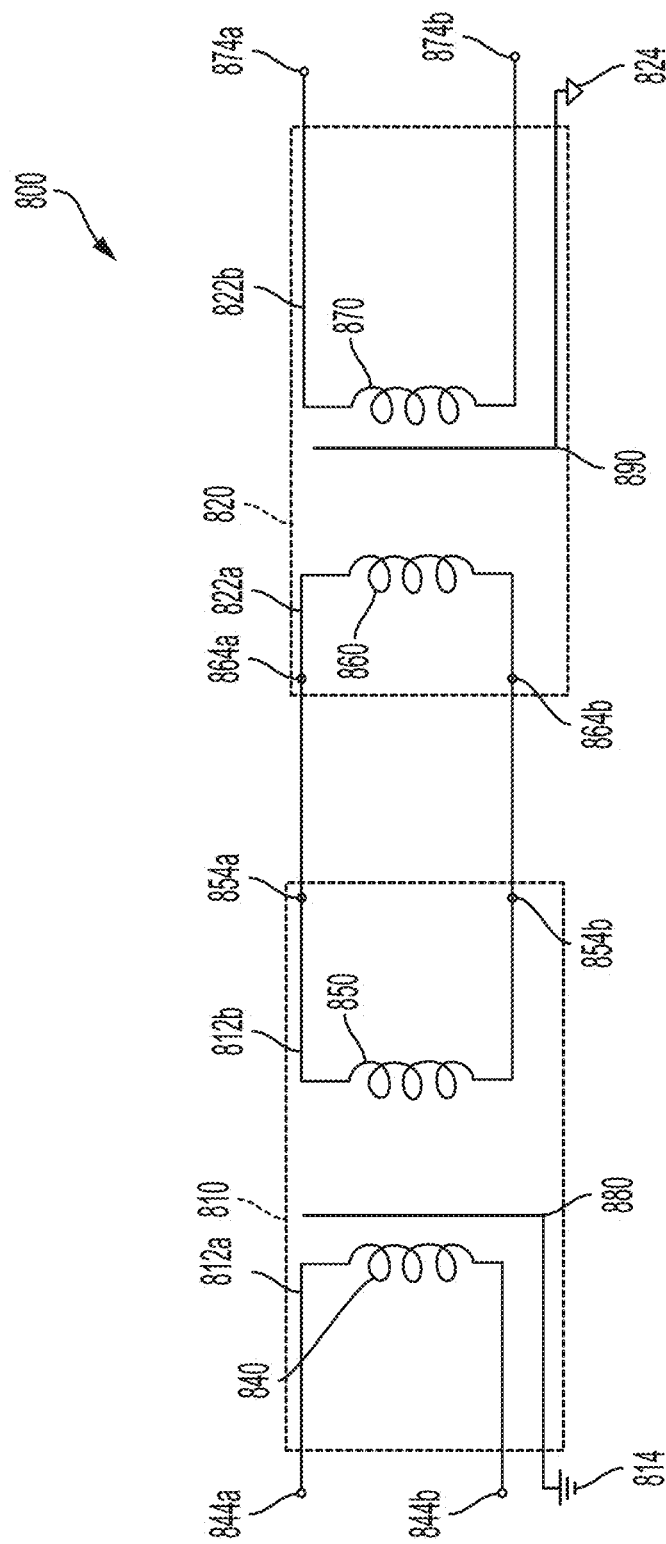
FIG. 8 is a schematic of a circuit comprising a transformer.

FIG. 8 shows an exemplary schematic of a circuit 800. Circuit 800 comprises a back to back transformer. The circuit 800 may be a circuit schematic implementation of the micro-scale planar-coil transformer 700. Circuit 800 includes a first transformer 810 having primary side 812a and secondary side 812b, a second transformer 820 having primary side 822a and secondary side 822b. Circuit 800 includes a first coil 840 having first terminal 844a and second terminal 844b, a second coil 850 having first terminal 854a and second terminal 854b, a third coil 860 having first terminal 864a and second terminal 864b, and a fourth coil 870 having first terminal 874a and second terminal 874b. Circuit 800 includes a first shield 880 coupled to primary side ground 814 and a second shield coupled to secondary side ground 824.

In a back to back transformer, to prevent the flow of common-mode current, each transformer pair of coupled coils may have a shield arranged therebetween. In some embodiments, each shield comprises a full shield, and the shields are arranged in a same layer. In some embodiments, the shields may comprise a same shield.

In some embodiments, a back to back transformer may comprise one or more partial shields. For example, a back to back micro-scale planar-coil transformer such as micro-scale planar-coil transformer 700 may comprise a partial shield. In FIG. 7, the micro-scale planar-coil transformer 700 comprises first shield 780 and second shield 790, which may each comprise a full shield. However, a back to back micro-scale planar-coil transformer may alternatively comprise a single shield, which may comprise a partial shield. For example, in some embodiments, the micro-scale planar-coil transformer 700 includes only one of the first shield 780 and the second shield 790. The one shield included in the back to back micro-scale planar-coil transformer may be arranged according to partial shield arrangement techniques described above with respect to FIG. 4. For example, the area of the partial shield may be patterned related to or at least partially based on the area of the first coil 740. Such an arrangement can reduce dipole radiation in a similar manner as described with respect to FIG. 4. This arrangement may require the same number of layers as a two full shield arrangement of micro-scale planar-coil transformer 700.

Each of the coils of a back to back transformer may include one or more coil portions as described above with respect to FIG. 2.

Figure 9:
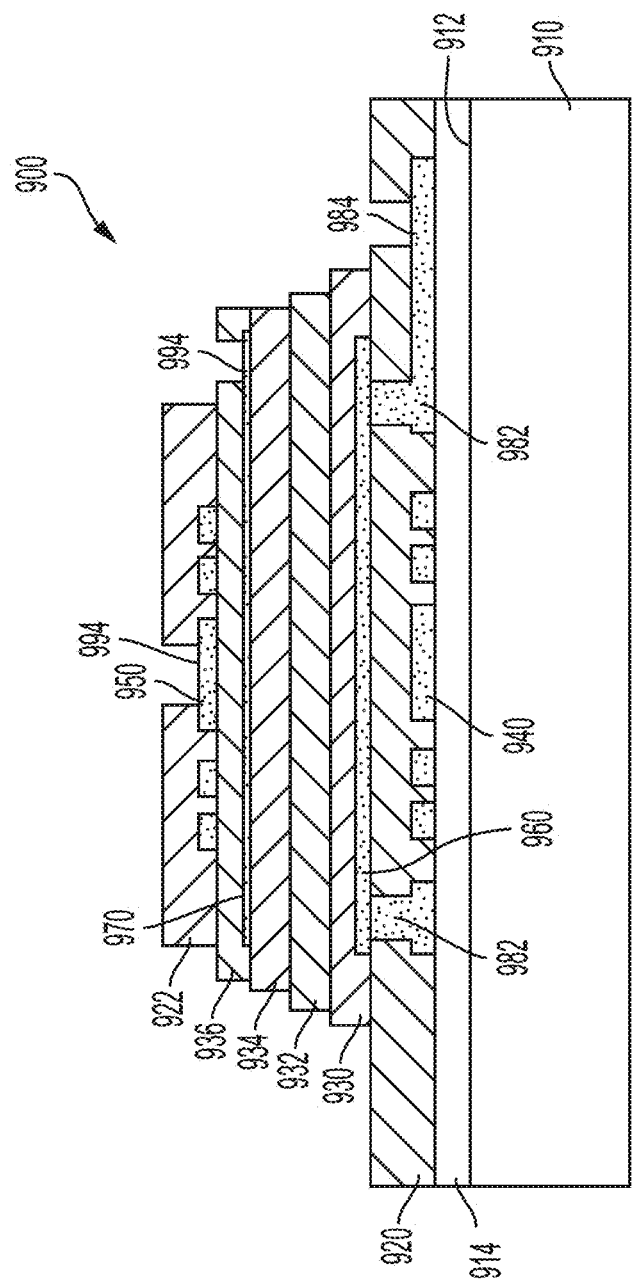
FIG. 9 is a cross-sectional side view of a micro-scale planar-coil transformer.

Some embodiments may include two shields. FIG. 9 shows a cross-sectional side view of a micro-scale planar-coil transformer 900. Micro-scale planar-coil transformer 900 includes two shields. Micro-scale planar-coil transformer 900 is arranged on a substrate 910 having an upper surface 912, and includes an underlying layer 914, lower coil layer 920, intermediate layers 930, 932, 934, and 936, upper coil layer 922, a first coil 940, a second coil 950, first shield 960, second shield 970, and vias 982. Portions 984 and 994 of the coils may be left exposed to provide coupling points.

Figure 10:
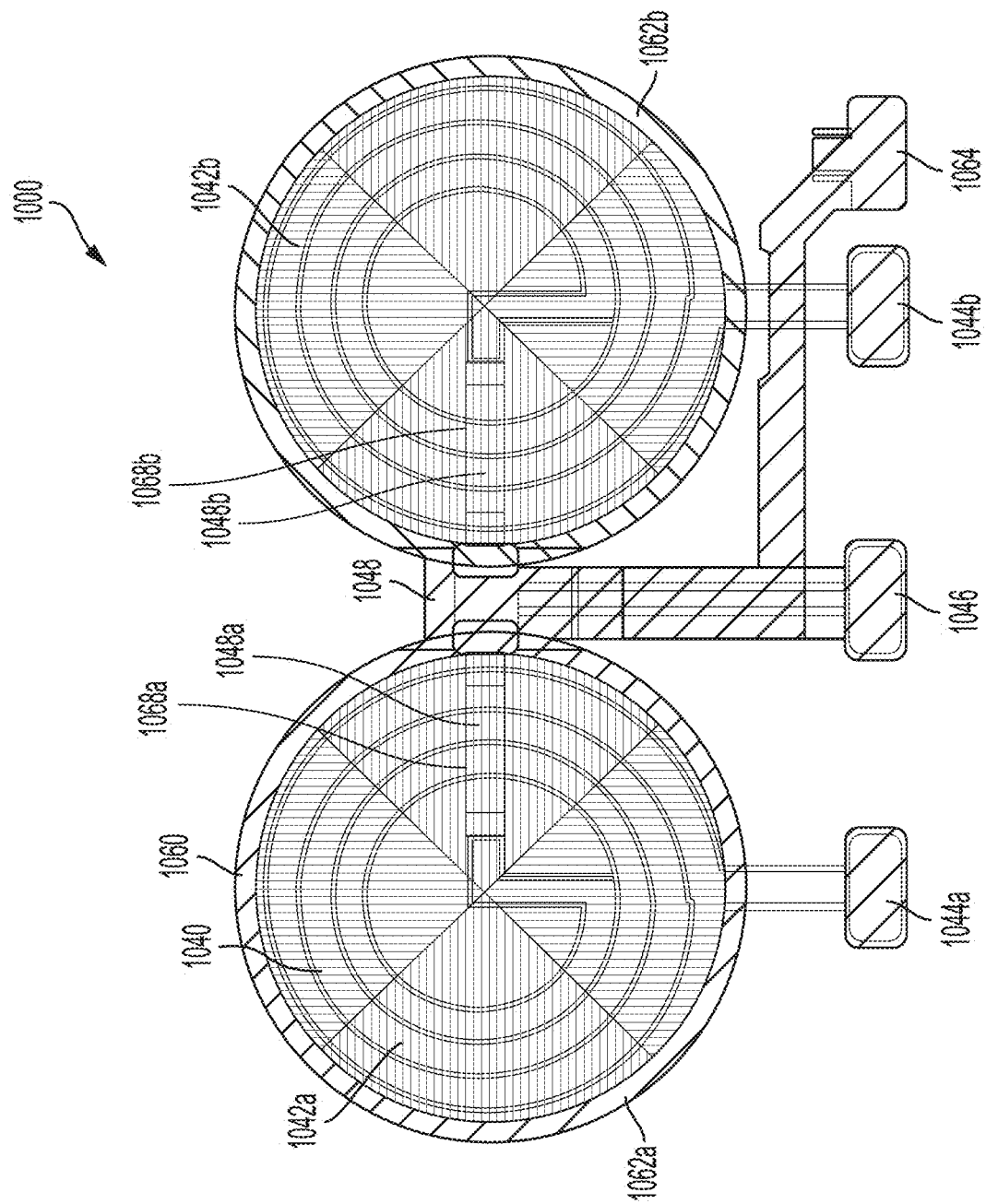
FIG. 10 is a top view of some components of a micro-scale planar-coil transformer.

FIG. 10 shows some components of a micro-scale planar-coil transformer 1000. The components of a micro-scale planar-coil transformer 1000 may comprise components of micro-scale planar-coil transformer 900. The components of a micro-scale planar-coil transformer 1000 comprises a first coil 1040 and shield 1060.

The first coil 1040 includes a first coil portion 1042a, a second coil portion 1042b, a first pad 1044a, a second pad 1044b, center tap pad 1046, and an intermediate portion 1048.

The shield 1060 includes first shield portion 1062a, second shield portion 1062b, shield pad 1064, intermediate portion 1066, first overpass opening 1068a, and second overpass opening 1068b. The shield 1060 may comprise each of the first shield 960 and second shield 970 in FIG. 9. A transformer having two shields may have two full shields. A first full shield may block common-mode current from crossing the isolation layer from the primary side, and a second full shield may block common-mode current from crossing the isolation layer from the secondary side.

Figure 11:
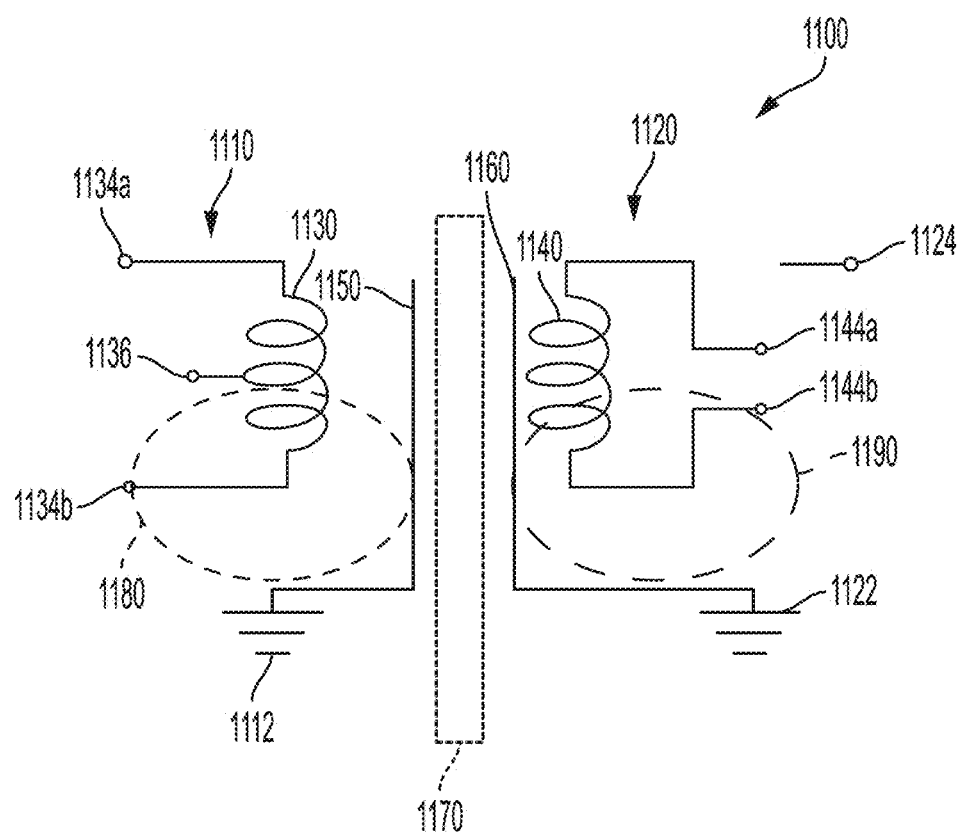
FIG. 11 is a schematic of a circuit comprising a transformer.

FIG. 11 shows an exemplary schematic of a circuit 1100. Circuit 1100 comprises a transformer comprising double shields. The circuit 1100 may be a circuit schematic implementation of the micro-scale planar-coil transformer 900. Circuit 1100 includes a primary side 1110 including a first coil 1130, and a first shield 1150 coupled to primary side ground 1112, a secondary side 1120 including a second coil 1140, and a second shield 1160 coupled to secondary side ground 1160, and an isolation layer 1170. First coil 1130 has a first terminal 1134a, a second terminal 1134b, and a center tap 1136. Second coil 1140 has a first terminal 1144a and a second terminal 1144b which are coupled to an output 1124.

Circuit 1100 comprises two full shields. The first shield 1150 and the second shield 1160 are configured to block the electric field between the first coil 1130 and the second coil 1140. Accordingly, most or substantially all of the common-mode current is blocked by the shields, and absorbed by a the primary side ground 1112 and the secondary side ground 1122. As such, most or substantially all of the common-mode current only flows in the loop 1180 and the loop 1190. Current in the loop 1080 flows only on the primary side 1110, and may be absorbed by the primary side ground. Current in the loop 1190 flows only on the secondary side 1120, and may be absorbed by the secondary side ground 1122. The current in each of the loops will not cross the isolation layer 1170. Because the loop 1180 is entirely on primary side 1110, and the loop 1190 is entirely on secondary side 1110, substantially zero common-mode current will cross the isolation layer and will not cause dipole radiation or induce EMI.

A double shield arrangement requires additional layers compared to single shield arrangements. For example, if overpass portions are arranged in shield layers, at least 4 layers are required. Some arrangements of double shields require 5 or more layers.

Each of the coils of a double shield transformer may include one or more coil portions as described above with respect to FIG. 2.

A method of manufacturing a micro-scale planar-coil transformer may comprise the steps of forming each of the layers described with respect to any of FIGS. 1, 7, and 9, and patterning each of the coils and shields. For example, a substrate may be provided. An underlying layer may be formed on the substrate. A first coil layer including a first coil may be formed on the underlying layer or on the substrate. The first coil may be patterned in the first coil layer in the arrangements described above. One or more intermediate layers including one or more shields may be formed on the first coil layer. The one or more shields may be pattered in the one or more intermediate layers in the arrangements described above. A second coil may be patterned above the intermediate layer in the arrangements described above. The second coil may be formed in a second coil layer.

A method of operating a micro-scale planar coil transformer may comprise the steps of applying a set of signals to the terminals of a first coil arranged on a primary side of the transformer such that the first coil has a first common-mode voltage ripple amplitude greater than substantially zero and a second coil arranged on a secondary side of the transformer that is electromagnetically coupled to the first coil has a second common-mode voltage ripple amplitude greater than or equal to zero and less than the first common-mode voltage ripple amplitude. The method may comprise reducing the dipole radiation between the first and second coils. The method may comprise blocking common-mode current between the first and second coils with a shield. The method may comprise blocking substantially all of the common-mode current with a full shield. The method may comprise exposing the second coil to a portion of the first common-mode voltage ripple amplitude where the portion is substantially equal to the second common-mode voltage ripple amplitude, using a partial shield. In some embodiments, a ratio of the portion to the first common-mode voltage ripple amplitude is substantially equal to a coupling factor of the first and second coils.

While shields in the present application may generally be described with respect to micro-scale planar-coil transformers that comprise center tapped coils made up of two coil portions, aspects of the present application may be applied to other transformers. For example, in some embodiments, shields described in the present application may be applied to other transformers which exhibit dipole radiation. In some embodiments, shields may be applied to other transformers which exhibit common-mode current crossing between a primary side and a secondary side. In some embodiments, shields may be applied to transformers which exhibit common-mode voltage ripple amplitudes differences between primary and secondary sides.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately," "substantially," and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A micro-scale planar-coil transformer arranged on a substrate having an upper surface, comprising:
   a first planar coil arranged in a first layer occupying a first area in a plane parallel to the upper surface;
   a second planar coil arranged in a second layer; and
   a shield arranged in an intermediate layer, the intermediate layer being between the first and second layers, wherein:
   a projection onto the first planar coil of a region enclosed by a perimeter of the shield covers a second area of the first planar coil that is less than the first area;
   a ratio A is equal to a ratio of the second area to the first area;
   a ratio B is equal to a ratio of a second common-mode voltage ripple amplitude of the second planar coil to a first common-mode voltage ripple amplitude of the first planar coil; and
   the ratio A and the ratio B comprise complementary percentages such that the ratio B is equal to ratio A subtracted from 100 percent, the second common-mode voltage ripple amplitude being less than the first common-mode voltage ripple amplitude.

2. The micro-scale planar-coil transformer of claim 1, wherein the shield is configured to expose the second planar coil to a portion of the first common-mode voltage ripple amplitude of the first planar coil.

3. The micro-scale planar-coil transformer of claim 2, wherein the shield is configured to expose the second planar coil to the ratio B of the first common-mode voltage ripple amplitude of the first planar coil.

4. The micro-scale planar-coil transformer of claim 1, wherein the ratio B of the second common-mode voltage ripple amplitude to the first common-mode voltage ripple amplitude is equal to a coupling coefficient of the first and second planar coils.

5. The micro-scale planar-coil transformer of claim 1, comprising only three metallization layers, the three metallization layers comprising the first layer, the second layer, and the intermediate layer.

6. The micro-scale planar-coil transformer of claim 1 comprising an overpass portion of the first coil arranged in the intermediate layer.

7. The micro-scale planar-coil transformer of claim 1, wherein the first planar coil is electromagnetically coupled to the second planar coil and wherein the micro-scale planar-coil transformer further comprises:
a third planar coil arranged in the second layer and coupled to the second planar coil; and
a fourth planar coil electromagnetically coupled to the third planar coil and arranged in the first layer.

8. A micro-scale planar-coil transformer, comprising:
a first planar coil arranged in a first layer;
a second planar coil arranged in a second layer; and
means for reducing dipole radiation between the first and second planar coils;
wherein the means for reducing dipole radiation between the first and second planar coils comprises means for absorbing a percentage A of a first common-mode voltage ripple amplitude of the first planar coil;
wherein a second common-mode voltage ripple amplitude of the second planar coil is equal to a percentage B of the first common-mode voltage ripple amplitude;
wherein the percentage A and the percentage B comprise complementary percentages such that the percentage B is equal to percentage A subtracted from 100 percent.

9. The micro-scale planar-coil transformer of claim 8, wherein the means for reducing dipole radiation between the first and second planar coils is configured to expose the second planar coil to a portion of the first common-mode voltage ripple amplitude of the first planar coil.

10. The micro-scale planar-coil transformer of claim 9, wherein the means for reducing dipole radiation between the first and second planar coils is configured to expose the second planar coil to the percentage B of the common-mode voltage ripple amplitude of the first planar coil.

11. The micro-scale planar-coil transformer of claim 8, wherein the means for reducing dipole radiation between the first and second planar coils comprises means for blocking common-mode current between the first and second planar coils.

12. The micro-scale planar-coil transformer of claim 8, wherein the percentage B is equal to a coupling factor of the first and second planar coils.

13. A micro-scale planar-coil transformer arranged on a substrate, the micro-scale planar-coil transformer comprising:
a first planar coil arranged in a first layer and configured to generate a first common-mode voltage ripple amplitude;
a second planar coil arranged in a second layer and configured to generate a second common-mode voltage ripple amplitude;
a shield arranged in an intermediate layer, the intermediate layer arranged between the first layer and the second layer,
wherein:
the shield covers a partial area of the first planar coil equal to (100%-B %) of the first planar coil; and
the B % is equal to the second common-mode voltage ripple amplitude divided by the first common-mode voltage ripple amplitude.

14. The micro-scale planar-coil transformer of claim 13, wherein:
the shield is configured to balance the first common-mode voltage ripple amplitude of the first planar coil with the second common-mode voltage ripple amplitude of the second planar coil by blocking the (100%-B %) of the first common-mode voltage ripple amplitude.

15. The micro-scale planar-coil transformer of claim 14, wherein:
the balancing of the first common-mode voltage ripple amplitude of the first planar coil with the second common-mode voltage ripple amplitude of the second planar coil by the shield is configured to reduce dipole radiation between the first planar coil and the second planar coil.

16. The micro-scale planar-coil transformer of claim 13, wherein:
the shield exposes the second planar coil to an area of the first planar coil equal to the B %.

17. The micro-scale planar-coil transformer of claim 13, wherein:
the B % is equal to a coupling coefficient of the first planar coil and the second planar coil.

18. The micro-scale planar-coil transformer of claim 13, further comprising:
comprising an overpass portion of the first planar coil arranged in the intermediate layer.

* * * * *